US010916292B1

(12) United States Patent
Zhou et al.

(10) Patent No.: US 10,916,292 B1
(45) Date of Patent: Feb. 9, 2021

(54) PERFORMING A REFRESH OPERATION BASED ON SYSTEM CHARACTERISTICS

(71) Applicant: Micron Technology, Inc., Boise, ID (US)

(72) Inventors: Zhenming Zhou, San Jose, CA (US); Tingjun Xie, Milpitas, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/554,026

(22) Filed: Aug. 28, 2019

(51) Int. Cl.
*G11C 11/406* (2006.01)
*G11C 7/22* (2006.01)
*G11C 11/4074* (2006.01)

(52) U.S. Cl.
CPC .......... *G11C 11/40611* (2013.01); *G11C 7/22* (2013.01); *G11C 11/4074* (2013.01); *G11C 11/40626* (2013.01)

(58) Field of Classification Search
CPC ......... G11C 11/40611; G11C 11/40626; G11C 11/4074; G11C 7/22

USPC .......................................................... 365/222
See application file for complete search history.

(56) References Cited

U.S. PATENT DOCUMENTS

| 2018/0329770 | A1* | 11/2018 | Saito | ................ G06F 11/0793 |
| 2018/0341773 | A1* | 11/2018 | Khatri | ................ H04L 9/002 |
| 2019/0244657 | A1* | 8/2019 | Kang | ................ G11C 11/40622 |

* cited by examiner

*Primary Examiner* — Fernando Hidalgo
(74) *Attorney, Agent, or Firm* — Lowenstein Sandler LLP

(57) ABSTRACT

A method for performing a refresh operation based on system characteristics is provided. The method includes determining that a current operating condition of a memory component is in a first state. The method also includes detecting a change in the operating condition from the first state to a second state. The method further includes setting a refresh period associated with the memory component based on the change of the operating condition. The refresh period corresponds to a period of time between a first time when a write operation is performed on a segment of the memory component and a second time when a refresh operation is to be performed on the segment. Moreover, the method includes performing the refresh operation according to the refresh period.

18 Claims, 6 Drawing Sheets

PERFORMING A REFRESH OPERATION BASED ON SYSTEM CHARACTERISTICS

TECHNICAL FIELD

Embodiments of the disclosure relate generally to memory sub-systems, and more specifically, relate to performing a refresh operation based on system characteristics.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
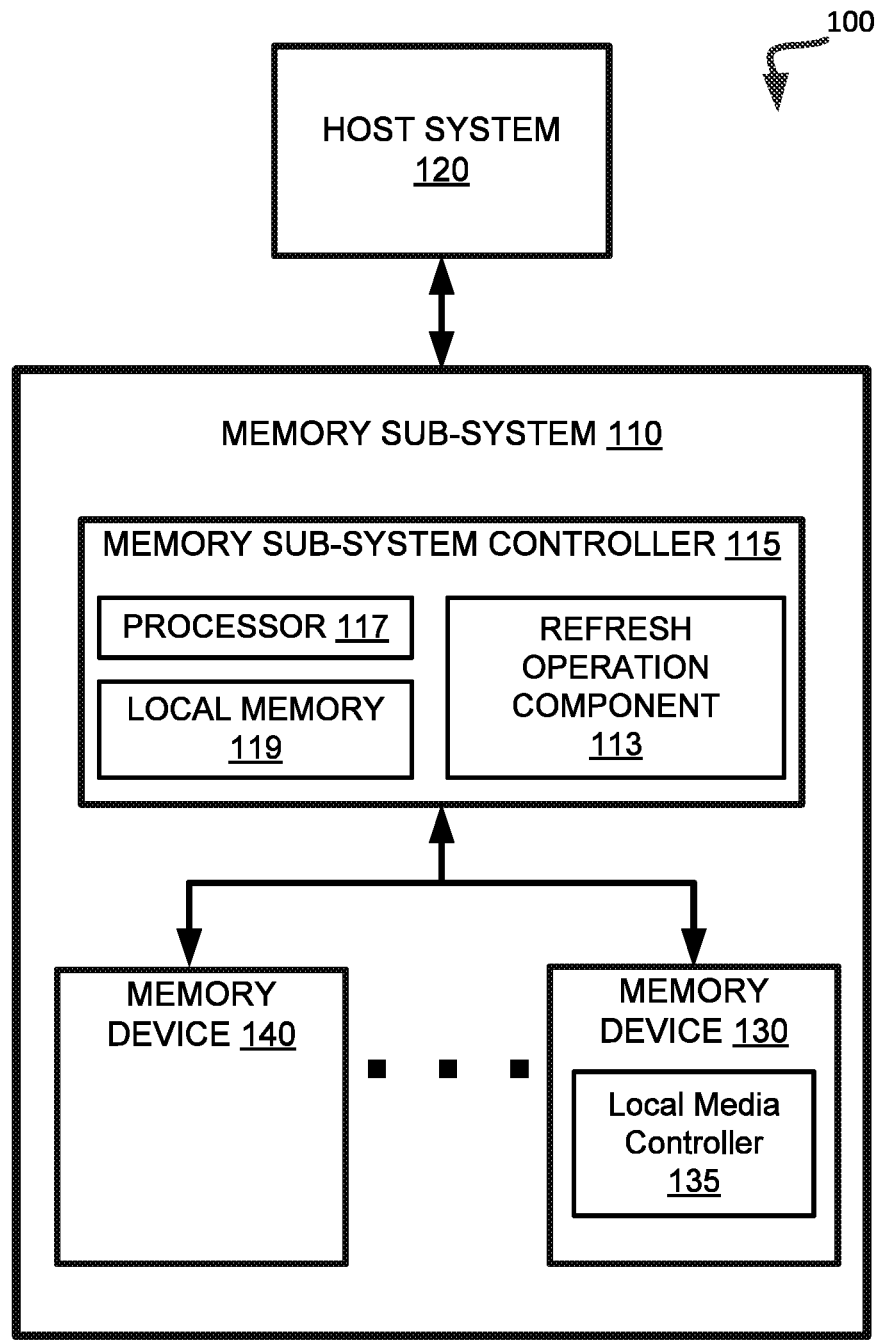
FIG. 1 illustrates an example computing environment that includes a memory sub-system in accordance with some embodiments of the present disclosure.

Aspects of the present disclosure are directed to performing a refresh operation based on system characteristics. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such memory devices that store data. The host system can provide data to be stored at the memory sub-system and can request data to be retrieved from the memory sub-system.

The memory components can include non-volatile memory devices that store data from the host system. A non-volatile memory device is a package of one or more dice. The dice in the packages can be assigned to one or more channels for communicating with a memory sub-system controller. The non-volatile memory devices include cells (i.e., electronic circuits that store information), that are grouped into pages to store bits of data. The non-volatile memory devices can include three-dimensional cross-point ("3D cross-point") memory devices that are a cross-point array of non-volatile memory that can perform bit storage based on a change of bulk resistance, in conjunction with a stackable cross-gridded data access array. Another example of a non-volatile memory device is a negative-and (NAND) memory device. Other examples of non-volatile memory devices are described below in conjunction with FIG. 1.

Certain types of memory components are prone to surge in demand of power supply for a read operation on a memory cell(s) of the respective memory components. The surge becomes greater as a time gap between when a write operation is performed and when a read operation is subsequently performed on the same memory cell(s) becomes bigger. The larger the time gap is, the more expensive (power-wise) it is for the memory sub-system to perform the read operation on certain types of memory components.

A conventional memory sub-system periodically performs a refresh operation at a fixed time period. A refresh operation involves a series of operations for reading data stored at a memory cell(s) (or a segment) of a memory component and re-writing the data back to the same memory cell(s). Because the data is read for the refresh operation on a periodic basis at a fixed time period, the conventional memory sub-system can prevent the time gap between the write and read operation from getting any greater than the fixed time period. However, a rate at which the demand of power supply for a read operation increases depends on various system characteristics of the memory sub-system. Therefore, such a rigid approach may not accommodate varying demand of power supply for certain types of memory components. If the demand of power supply is not accommodated properly, the conventional memory sub-system may not be able to perform a read operation due to shortage of power available to carry out the operation.

Aspects of the present disclosure address the above and other deficiencies by having a memory sub-system that dynamically adjusts a frequency of a refresh operation based on system characteristics of the memory sub-system such as a temperature of an operating environment, a level of power being supplied to the memory sub-system, and power consumption characteristics of memory components. Depending on the system characteristics, the memory sub-system can adjust a time period for scheduling a refresh operation in order to prevent the memory sub-system from failing to perform a read operation because the read operation requires more power than what is available to the memory sub-system.

Advantages of the present disclosure include, but are not limited to, efficiently managing a limited supply of power to a memory sub-system. For example, as a memory sub-system dynamically adjusts a time period for performing a refresh operation, the memory sub-system can accommodate the varying demand of power supply to perform a read operation. Accordingly, the memory sub-system can ensure that an amount of power for a read operation required by certain memory components does not exceed an amount of power available.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, a vehicle (e.g., airplane, drone, train, automobile, or other conveyance), Internet of Things (IoT) devices, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components, such as memory devices 130, when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory devices such as 3D cross-point type and NAND type memory are described, the memory device 130 can be based on any other type of non-volatile memory, such as read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages or codewords that can refer to a logical unit of the memory device used to store data. With some types of memory (e.g., NAND), pages can be grouped to form blocks. Some types of memory, such as 3D cross-point, can group pages across dice and channels to form management units (MUs).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a refresh operation component 113 that can dynamically adjust a period at which a refresh operation is to be performed for each memory component (e.g., memory devices 130 or 140), based on various system characteristics, such as a temperature of an operating environment, a level of power being supplied to the memory sub-system 110, power consumption characteristics of memory components (e.g., memory devices 130 and 140), or other characteristics. A refresh operation herein refers to a sequence of operations involving first, a selection operation for selecting a target segment of a memory component, a read operation for reading data stored at the selected target segment, and a re-write operation to write or store the read data back to the target segment of the memory component. In some embodiments, the refresh operation may involve just the read operation and the re-write operation. In some embodiments, the memory sub-system controller 115 includes at least a portion of the refresh operation component 113. For example, the memory sub-system controller 115 can include a processor 117 (processing device) configured to execute instructions stored in local memory 119 for performing the operations described herein. In some embodiments, the refresh operation component 113 is part of the host system 110, an application, or an operating system.

The refresh operation component 113 adjusts how often a refresh operation should be performed for each memory component (e.g. a memory device 130 or 140) based on system characteristics. In one implementation, the refresh operation component 113 determines a current operation condition (e.g., a temperature of a memory device 130 or 140, an amount of power being supplied to the memory sub-system 110). The refresh operation component 113 also detects a change in the operation condition and sets a refresh period associated with the memory component based on the change of the operating condition. A refresh period used herein refers to a period of time between a time when a write operation is performed on a segment of the memory component and another time (i.e., a later time) when a refresh operation is to be performed on the segment. Then, the refresh operation component 113 can perform the refresh operation according to the refresh period.

In another implementation, the refresh operation component 113 can receive a command for a write operation to store data on a segment of a memory component. The refresh operation component 113 can identify the memory component associated with the write operation from a plurality of memory components. Then, the refresh operation component 113 can determine a refresh period corresponding to the identified memory component from a plurality of refresh periods, where each one of the plurality of refresh periods corresponds to a different one or more of the plurality of memory components. In response to determining that a command for a read operation to be performed on the segment of the memory component is not received within the refresh period, the refresh operation component 113 can perform the refresh operation on the segment of the memory component. Further details with regards to the operations of the refresh operation component 113 are described below.

Figure 2:
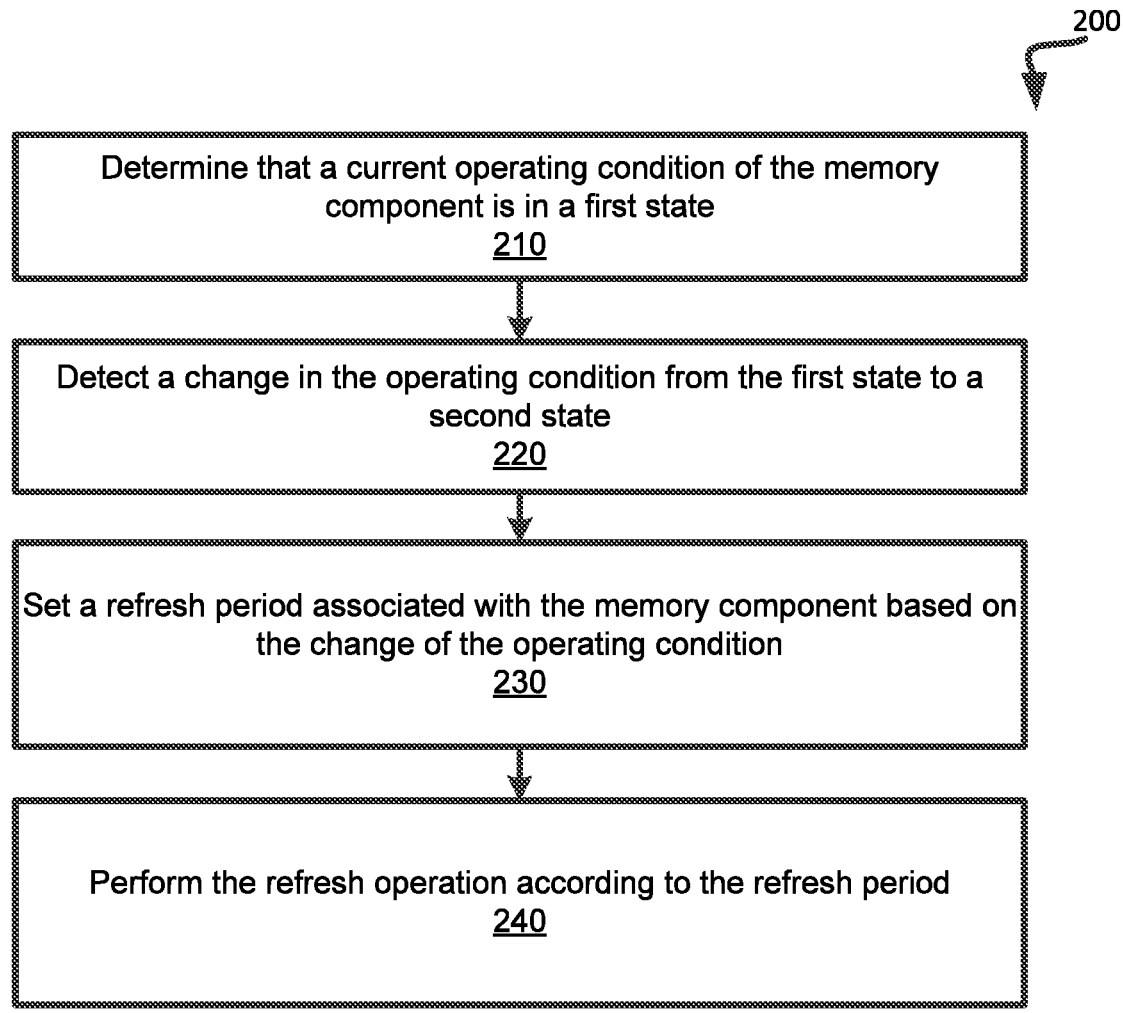
FIG. 2 is a flow diagram of an example method to perform a refresh operation in accordance with some embodiments of the present disclosure.

FIG. 2 is a flow diagram of an example method 200 to perform a refresh operation in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the refresh operation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing device determines that a current operating condition of the memory component is in a first state. In some embodiments, an operation condition of the memory component can include an amount of power supplied to a memory sub-system (e.g., the memory sub-system 110 of FIG. 1) and/or a temperature of the memory component. For example, the processing device can measure a current level (in mW) of the power supplied to the memory sub-system. The processing device can determine the current level of the power to be the first state of the current operating condition of the memory component. In another example, the processing device can determine the current temperature of the memory component. Additionally or alternatively, the processing device can determine the temperature of the memory sub-system or a host system (e.g., the host system 120 of FIG. 1) connected to the memory sub-system. Then, the processing device can determine the temperature as the first state of the current operation condition of the memory component. For example, the processing device can determine that the current power supply level to be 1780 mW and/or the current temperature to be 55 F.

At operation 220, the processing device detects a change in the operating condition from the first state determined at the operation 210 to another state (e.g., a second state). In one implementation, the processing device determines a range of the operation condition to which the first state determined at the operation 210 belongs. For example, the range of the operation condition can correspond to a range of power supply levels and/or a range of temperatures. There can be multiple ranges of the operation condition. As an example, ranges of power supply levels can be 1700 mW (inclusive) to 1750 mW (exclusive), 1750 mW to 1800 mW, 1800 mW to 1850 mW. As another example, the range of temperatures can be 50 F (inclusive) to 60 F (exclusive), 60 F to 70 F, 70 F to 80 F. For example, for the current power supply level (e.g., 1780 mW), the processing device can determine that the current state belongs to the range from 1750 mW to 1800 mW.

As another example, for the current temperature (e.g., 55 F), the processing device can determine that the current state belongs to the range from 50 F to 60 F. In one implementation, a range can be at one level, such as 1700 mW. In another implementation, the ranges can be at different increments, such as 1700 mW to 1750 mW (i.e., 50 mW increment) and 1800 mW to 1900 mW (i.e., 100 mW increment). Yet, in another implementation, the ranges can be discontinuous. For example, there can be two ranges one from 1700 mW to 1750 mW and 1800 mW to 1850 mW. Further, in another implementation, the ranges can specify a combination of two operation conditions such as for each range of temperatures, 50 F to 60 F, 60 F to 70 F, 70 F to 80 F, there can be different ranges of power supply levels such as 1700 mW to 1749 mW, 1750 mW to 1799 mW, 1800 mW to 1849 mW.

The processing device can determine the state of the current operation condition on a periodic basis, such as every ten minutes, every hour, etc. Accordingly, the processing device can determine another state of the operation condition. Therefore, once the processing device has determined the range for the state of operation condition from the operation 210, the processing device can determine whether the state measured after, for example ten minutes, belongs to the same range of the operation condition. For example, the processing device could have determined a power supply level to be 1785 mW ten minutes after determining that the power supply level as 1780 mW. Given the range from 1750 mW to 1800 mW, the processing device can determine that the most recent state belongs to the same range. On the other hand, the processing device could have determined the power supply level to be 1730 mW after ten minutes of measuring the power supply level of 1780 mW, in such an instance, the processing device can determine that the most recent state does not belong to the same range.

In another example, the processing device could have determined a temperature to be 58 F as opposed to 50 F the temperature measured an hour ago. In such a case, the processing device can determine that the most recent state belongs to the same range (e.g., 50 F to 60 F) as the other state (i.e., 50 F) of the operation condition. Yet in another example, the processing device could have determined a temperature to be 75 F as opposed to 50 F, the temperature measured an hour ago. In such a case, the processing device can determine that the most recent state does not belong to the same range (e.g., 50 F to 60 F).

In response to determining that the latest state of the operation condition does not belong to the previously determined range of the operation condition, the processing device can determine that the change in the operation condition is detected. For example, a change in the operation condition from one state to another state can correspond to an increase in a temperature of the memory component or a decrease in the temperature of the memory component. Such change can be detected when a temperature in an operating environment (e.g., a server room) of the memory sub-system fluctuates. In another example, a change in the operation condition can correspond to an increase in an amount of power supply to the memory sub-system or a decrease in the amount of power supply to the memory sub-system. Usually, the memory sub-system is supplied with a constant amount of power (i.e., a power budget of the memory sub-system). However, sometimes, a sudden drop in an amount of power can happen (such phenomenon is called a power droop).

At operation 230, the processing device sets a refresh period associated with the memory component based on the change of the operating condition. In one implementation, a refresh period corresponds to a period of time between a time when a write operation is performed on a segment of the memory component and a time when a refresh operation is to be performed on the segment. That is, the refresh period can refer to an amount of time passed since a write operation was performed on a segment of the memory component until a refresh operation is performed on the same segment of the memory component. A refresh operation herein refers to a sequence of operations involving first, a selection operation for selecting a target segment of a memory component, a read operation for reading data stored at the selected target segment, and a re-write operation to write or store the read data back to the target segment of the memory component. In some embodiments, the refresh operation may involve just the read operation and the re-write operation, without the selection operation. In some embodiments, each memory component is associated with a refresh period. A default value can be initially assigned to refresh periods. The refresh periods can be set to the same value or different values in a unit of time, such as 3 hours.

To set the refresh period associated with the memory component, the processing device determines a range of the operation condition to which the later state belongs (e.g., a temperature and/or power supply level measured at a later time). The processing device can determine the range for the later state of operation condition in a similar manner as described above with respect to operation 220. For example, the processing device could have initially determined the power supply level to be 1780 mW (which belongs to the range of 1750 mW to 1800 mW), but after ten minutes, the power supply level could have been changed to 1730 mW. Then, the processing device can determine that the new range of operation condition is 1700 mW to 1750 mW.

In one implementation, each range can have a corresponding refresh period. Once the range is determined, the processing device can determine a refresh period associated with the determined range of the operation condition. Details about determining a refresh period for each range will be described below with respect to FIGS. 3A and 3B. In one implementation, a refresh period for each range can be pre-determined and stored at a memory of a memory sub-system controller or a memory of a local media controller. Accordingly, the processing device can determine the refresh period by accessing such a memory. Then, the processing device can change the refresh period associated with the memory component to correspond to the refresh period associated with the range for the later state of operation condition. For example, when a power supply level changed from 1780 mW (which belongs to a range of 1750 mW to 1800 mW having a refresh period of 10 hours assigned to the range) to 1850 mW (which belongs to a range of 1850 mW to 1900 mW having a refresh period of 13 hours assigned to the range), the processing device can change the refresh period from 10 hours to 13 hours. In another implementation, the processing device can change a refresh period at its default value to a refresh period corresponding to the range for the later state of operation condition.

In instances where the change in the operation condition from one state to another state involves an increase in a temperature of the memory component, the processing device can set the refresh period to be at a shorter period of time (i.e., the processing device can decrease the refresh period based on the increased temperature). On the other hand, when the change in the operation condition from one state to another state corresponds to a decrease in the temperature of the memory component, the processing device can set the refresh period to be at a longer period of time (i.e., the processing device can increase the refresh period based on the decreased temperature). Such inverse relationship between the change in the temperature and the refresh period is illustrated in FIG. 3A.

As another example, the change in the operation condition can involve an increase in an amount of power supply to the memory sub-system. In such a case, the processing device can set the refresh period to be at a longer period of time (i.e., the processing device can increase the refresh period based on the increased amount of power supply). On the other hand, sometimes, a sudden drop in an amount of power being supplied can happen (such phenomenon is called a power droop). However, in case of the power droop, the processing device can adjust a refresh period accordingly, in order to accommodate less amount of power available to perform operations in the memory sub-system. Thus, when the amount of power supply is decreased, the processing device can set the refresh period to be at a shorter period of time (i.e., the processing device can decrease the refresh period based on the decreased amount of power supply). Such direct relationship between the change in the amount of power supply and the refresh period is illustrated in FIG. 3B.

At operation 240, the processing device performs the refresh operation according to the refresh period. In one implementation, when the processing device performs a write operation on a segment of the memory component, the processing device can start a counter for the segment. In response to determining that a count value of the counter becomes the same value as the period of time (e.g., 10 hours) defined by the refresh period, the processing device can perform the refresh operation. That is, when the counter indicates that 10 hours have passed since the last write operation was performed on the segment, the processing device can select the segment of the memory component, read data written to the segment, and re-write the data back to the segment. The processing device can maintain a counter for each segment of the memory component whenever a write operation is performed. In another implementation, the processing device can obtain a timestamp when a write operation is performed to a segment and calculate an amount of time passed since the write operation on a periodic basis. Based on the calculated amount of time, the processing device can initiate the refresh operation.

Figure 3A:
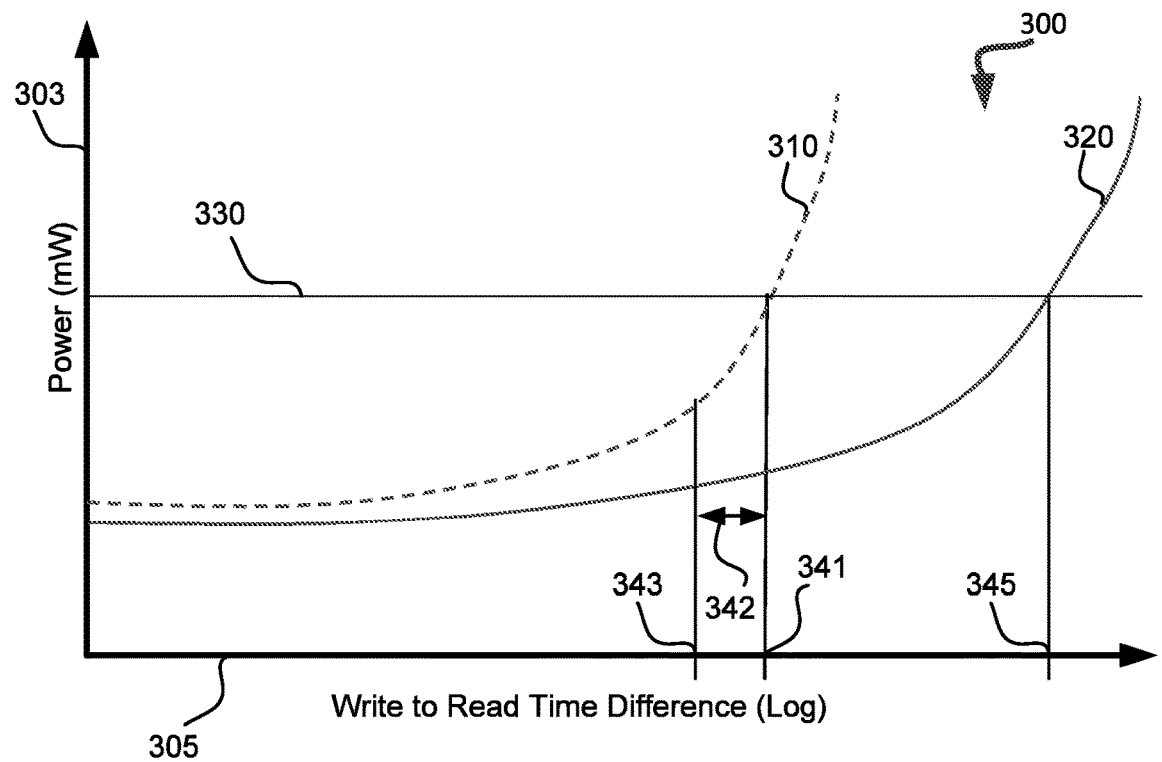
FIG. 3A is a graph illustrating a power level as a function of a write to read time difference for two different temperatures in accordance with some embodiments of the present disclosure.
Figure 3B:
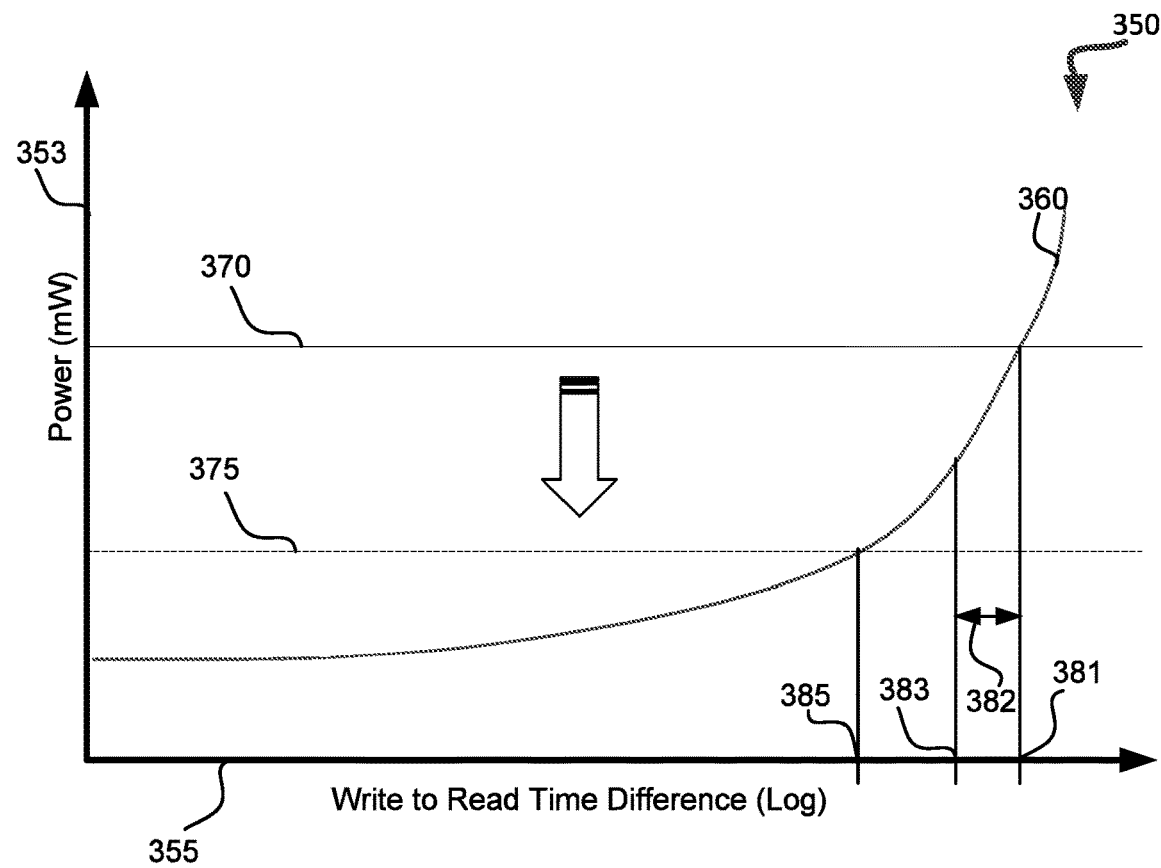
FIG. 3B is a graph illustrating a power level as a function of a write to read time difference in accordance with some embodiments of the present disclosure.

FIG. 3A is a graph 300 illustrating a power level as a function of a write to read time difference for two different temperatures in accordance with some embodiments of the present disclosure. The refresh operation component 113 of FIG. 1 can determine an appropriate refresh period for a memory component having different ranges of temperatures.

As illustrated in FIG. 3A, the graph 300 has two axes—a power level axis 303 and a write to read time difference axis 305. The power level axis 303 represents a level or an amount of power required by a memory component (e.g., the memory component 130 or 140 of FIG. 1) or a memory sub-system (e.g., the memory sub-system 110 of FIG. 1) for a read operation on a segment of the memory component. The power level is expressed in units of mW. The write to read time difference axis 305 represents an amount of time elapsed since a write operation was performed on a segment of a memory component until a read operation was performed subsequently. The time is expressed in terms of logarithms.

A curve 310 represents a relationship between the power level and the write to read time difference for the memory component or the memory sub-system in a high temperature environment, such as 80 F. In some embodiments, the high temperature environment can be defined by a range of temperatures, such as 70 F to 80 F. As depicted, the curve 310 illustrates an exponential relationship between the power level required for a read operation and an amount of time between performance of a write and read operation. Accordingly, the longer the time difference between performance of a write and read operation is, the higher level of power is required to perform the read operation.

A curve 320 represents a relationship between the power level and the write to read time difference for the memory component or the memory sub-system in a low temperature environment, such as 60 F. The low temperature environment can correspond to a range of temperatures, such as 50 F to 60 F. Similar to the curve 310, the curve 320 represents the exponential relationship. A horizontal line 330 represents a power budget for the memory component or the memory sub-system. In one implementation, the power budget refers to an amount of power supplied to the memory component or the memory sub-system.

A processing device, such as the refresh operation component 113 of FIG. 1, can determine a refresh period for a memory component based on the relationship represented by the curves 310 and 320. For example, the processing device can determine a time at point 341 (e.g., 24 hours) where the curve 310 meets the power budget line 330. The time point 341 can represent the maximum value for a refresh period corresponding to the high temperature environment (because if a refresh period is performed within any time after the time at the time point 341, there would be not enough power to perform the refresh operation). In one implementation, the processing device can assign a time corresponding to the time point 341 as the refresh period for the high temperature environment. That is, the processing device can initiate a refresh operation or shortly before 24 hours have passed since the last write operation on a respective segment of the memory component. In this way, the processing device can avoid running out of power.

In another implementation, the processing device can determine a time point (e.g., time point 343) within a threshold amount 342 of the time point 341. Such a threshold amount can be a relative value, such as 10%, or an absolute value, such as, 2 hours. For example, the time point 341 can be 24 hours and the threshold amount 342 can be 2 hours. Then, the processing device can determine another time point 343 (e.g., 22 hours) based on the maximum time a refresh operation should be performed (as represented by the time point 341) and the threshold amount 342. The processing device can assign a refresh period of 22 hours to the high temperature environment.

Similarly, the processing device can determine a refresh period for the low temperature environment. For example, the processing device can determine that a time period represented by a time point 345 (e.g., 40 hours) as the refresh period. In another implementation, the processing device can determine a time period less than the maximum time period represented by the time point 345 using the same threshold 342. As illustrated by the curves 310 and 320, as the temperature of an operation environment becomes lower, the processing device sets the refresh time period to be at a shorter amount of time. Therefore, based on the different refresh periods for different ranges of temperatures, the processing device can determine appropriate refresh period for a changed operation condition, for example, at operation 230 of FIG. 2. Accordingly, the processing device can adjust a refresh period in order to accommodate changes in temperature of an operating environment (e.g., a temperature change in a server room where the memory sub-system resides).

FIG. 3B is a graph 350 illustrating a power level as a function of a write to read time difference in accordance with some embodiments of the present disclosure. The refresh operation component 113 of FIG. 1 can determine an appropriate refresh period for a memory component under different power supply conditions.

Same as the graph 300 in FIG. 3A, the graph 350 has two axes—a power level axis 353 and a write to read time difference axis 355. A curve 360 represents a relationship between the power level and the write to read time difference for a memory component or a memory sub-system. A horizontal line 370 represents a power budget (e.g., 800 mW) for a memory component or a memory sub-system. As described above, the power budget refers to an amount of power supplied to the memory component or the memory sub-system. In another example, the line 370 can represent a range of power levels such as 750 mW to 800 mW. Usually, a constant level of power (i.e., a power budget) is supplied to the memory component or the memory sub-system. However, under certain circumstances, a power droop can happen (i.e., a sudden drop in an amount of power being supplied). For example, the power supply level can drop from 800 mW to 600 mW as represented by a horizontal line 375.

A processing device, such as the refresh operation component 113 of FIG. 1, can determine a refresh period for a memory component based on the power level represented by the line 370. For example, the processing device can determine a time at point 381 (e.g., 44 hours) where the curve 360 meets the power budget line 370. The time point 381 can represent the maximum value for a refresh period given the power budget. In one implementation, the processing device can assign a time corresponding to the time point 381 as the refresh period for the amount of power supplied as represented by the line 370. Accordingly, the processing device can initiate a refresh operation at or shortly before 44 hours have passed since the last write operation on a respective segment of the memory component.

In another implementation, the processing device can use a threshold value 382 similar to the threshold value of 342 to determine another refresh time at time point 383. Similarly, the processing device can determine a refresh period for a lower power level (e.g., 600 mW) represented by the line 375. For example, the processing device can determine a time period represented by a time point 385 (e.g., 41 hours) as the refresh period for the reduced power level. Therefore, based on the different refresh periods for different levels of power supply, the processing device can determine appropriate refresh period for a changed operation condition (e.g., a power droop), for example, at operation 230 of FIG. 2. Accordingly, the processing device can adjust a refresh period in order to accommodate the less amount of power available.

Figure 4:
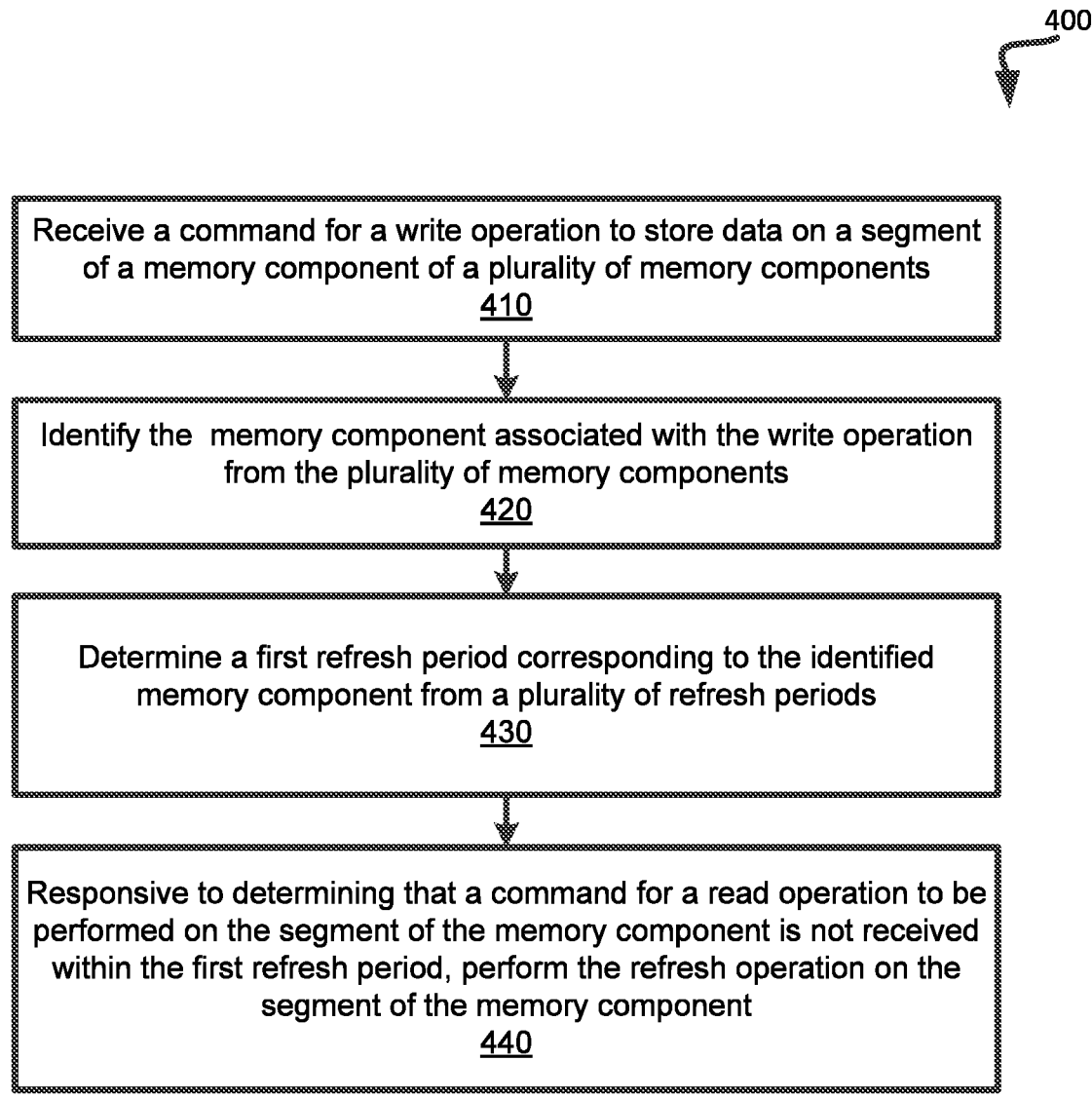
FIG. 4 is a flow diagram of an example method to perform a refresh operation in accordance with some other embodiments of the present disclosure.

FIG. 4 is a flow diagram of an example method 400 to perform a refresh operation in accordance with some other embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the refresh operation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing device receives a command for a write operation to store data on a segment of a memory component of a plurality of memory components. The processing device can receive the command from a local media controller (e.g., the local media controller 135), a memory sub-system controller (e.g., the memory sub-system controller 115), or a host system (e.g., the host system 120). The command can specify a memory component and a segment within the memory component for the write operation. In further implementation, the processing device can perform a write operation in accordance with the received command.

At operation 420, the processing device identifies the memory component associated with the write operation from the plurality of memory components. In one implementation, the processing device can determine the memory component from the command received at operation 410. In another implementation, the processing device can receive the memory component associated with the write operation of the command, from the local media controller (e.g., the local media controller 135), the memory sub-system controller (e.g., the memory sub-system controller 115), or the host system (e.g., the host system 120).

At operation 430, the processing device determines a refresh period corresponding to the identified memory component from a plurality of refresh periods. As described above, a refresh period, corresponds to a period of time between a time when the write operation is performed on a segment of the memory component and a time when a refresh operation is to be performed on the same segment of the memory component. In one implementation, each refresh period from the plurality of refresh periods corresponds to a different one or more memory components. Moreover, the refresh periods can be different from each other.

To determine the refresh period corresponding to the identified memory component, the processing device determines a group from a plurality of groups to which the identified memory component belongs. In identifying the memory component, the processing device can reference a table listing an identifier for memory component(s) for each group. A group can also be indicated by an identifier in the table. Such a table can be stored at a memory of a memory sub-system controller or a memory of a local media controller and accessed by the processing device. Each group in the plurality of groups includes a different one or more of the plurality of memory components. That is, each group is comprised of different memory component(s). Also, each group of memory components corresponds to each one of the plurality of refresh periods. Accordingly, for each group, there is one corresponding refresh period. Details about how a refresh period for each group is determined will be described with respect to FIG. 5. In one implementation, a refresh period for each group can be pre-determined and stored at the memory of a memory sub-system controller or the local media controller. Accordingly, the processing device can determine the refresh period by accessing such a memory.

The plurality of memory components can be divided into groups based on an amount of power required (i.e., power consumption characteristic of a memory component) for a read operation to be performed on a segment of the respective memory components. Thus, each group is associated with different ranges of an amount of power required for a read operation. Accordingly, memory components in the same group would require an amount of power within the same range (e.g., 700 mW-800 mW) for a read operation be performed on a segment of a respective memory component within a given time period (i.e., the same amount of time). In one implementation, the given time can correspond to an amount of time, such as 40 hours, after a write operation was performed on the respective segment.

For example, there may be three groups each associated with a range of 500 mW-600 mW (i.e., equal to or more than 500 mW and less than 600 mW), 600 mW-700 mW, and 700 mW-800 mW having 40 hours, 42 hours, and 44 hours of corresponding refresh periods, respectively. As such, a group associated with a higher range (e.g., a range of 700 mW-800 mW compared to a range of 500 mW-600 mW) of the amount of power required for the read operation corresponds to a refresh period having a shorter period of time (e.g., 40 hours compared to 44 hours). That is, the group associated with the range of 700 mW-800 mW is assigned a refresh period of 40 hours. In contrast, a group associated with a lower range (e.g., 500 mW-600 mW) has a corresponding refresh period (e.g., 44 hours) of a longer period of time. Further details regarding the groups of memory components and corresponding refresh periods will be described with respect to FIG. 5 below. Once the processing device determines a group associated with the identified memory component for the write operation, the processing device can determine a refresh period corresponding to the group. In determining a refresh period corresponding to a group, the processing device can reference a table listing a refresh period for each group.

At operation 440, the processing device, responsive to determining that a command for a read operation to be performed on the segment of the memory component is not received within the refresh period, performs the refresh operation on the segment of the memory component. As described above, the processing device can use a counter or a timestamp to check whether the read operation command is received (or whether the read operation is performed) within the refresh period.

In further embodiments, the processing device can adjust the refresh period determined at operation 430, based on at least one of an amount of power supplied to the memory sub-system or a temperature of the memory component as described above with respect to FIG. 4. That is, for each group of memory components, the refresh period can be changed based on a newly determined temperature and/or level of power supply.

Figure 5:
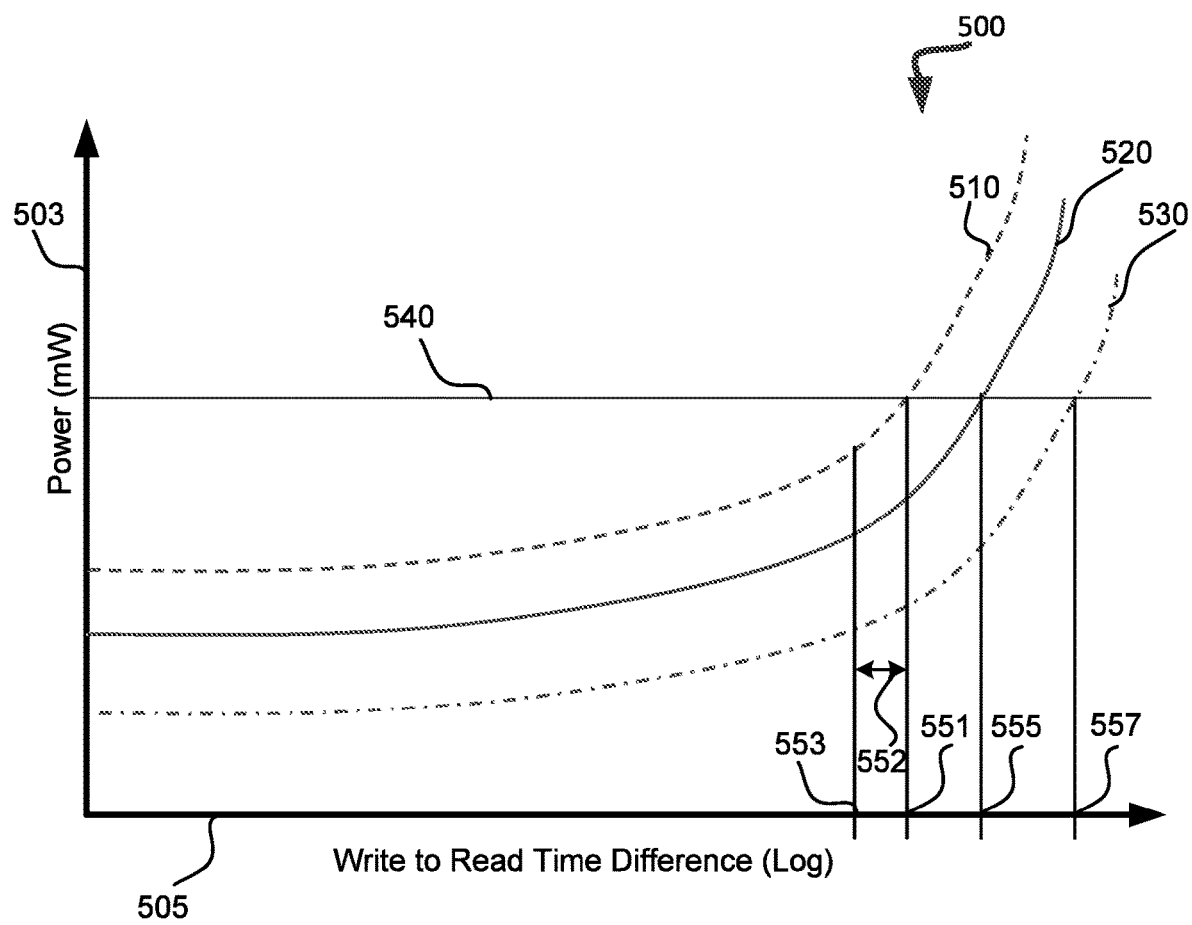
FIG. 5 is a graph illustrating a power level as a function of a write to read time difference for three different memory components in accordance with some embodiments of the present disclosure.

FIG. 5 is a graph 500 illustrating a power level as a function of a write to read time difference for three different memory components in accordance with some embodiments of the present disclosure. The refresh operation component 113 of FIG. 1 can determine an appropriate refresh period for a memory component belonging to different groups.

As illustrated in FIG. 5, the graph 500 has two axes—a power level axis 503 and a write to read time difference axis 505. Similar to the power level axis 303, the power level axis 503 represents a level or an amount of power required by a memory component (e.g., the memory component 130 or 140 of FIG. 1) or a memory sub-system (e.g., the memory sub-system 110 of FIG. 1) for a read operation on a segment of the memory component. The power level is expressed in units of mW. Similar to the write to read time difference axis 305, the write to read time difference axis 505 represents an amount of time elapsed since a write operation was performed on a segment of a memory component until a read operation was performed subsequently. The time is expressed in terms of logarithms. Moreover, as with the horizontal line 330 of FIG. 3A, a horizontal line 540 represents a power budget for a memory component or a memory sub-system. In one implementation, the power budget refers to an amount of power supplied to the memory component or the memory sub-system.

Curves 510 to 530 represent a relationship between the power level and the write to read time difference for a memory component belonging different groups. Memory components of a memory sub-system can be divided into groups based on an amount of power required (i.e., power consumption characteristics) for a read operation to be performed on a segment of the respective memory component(s). For example, at a time point 553 (e.g., 30 hours passed since performance of a write operation until performance of a subsequent read operation), one or more memory components that require 600 mW of power for performance of a read operation can be in one group (and thus represented by the curve 510). Such one or more memory components can be grouped into one group. In some embodiments, memory components requiring a range of power level (e.g., 550 mW to 650 mW) can be grouped together. As another example, at time point 553, one or more memory components that require 500 mW of power for performance of a read operation can be in another group and accordingly represented by the curve 520. Yet in another example, at time point 553, one or more memory components that require 400 mW of power for performance of a read operation can be in another group and accordingly represented by the curve 530. Accordingly, memory components can be grouped based on the amount of power they require to do a read operation at a given write to read time period (e.g., the time period of the time point 553).

As depicted, the curves 510 to 530 illustrate an exponential relationship between the power level required for a read operation and an amount of time between performance of a write and read operation. Accordingly, the longer the time difference between performance of a write and read operation is, the higher level of power is required to perform the read operation.

A processing device, such as the refresh operation component 113 of FIG. 1, can determine a refresh period for a memory component based on the relationship represented by the curves 510 to 530. For example, the processing device can determine a time at time point 551 (e.g., 32 hours) where the curve 510 meets the power budget line 540. The time point 551 can represent the maximum value for a refresh period corresponding to a group of memory component(s) requiring highest power level for performance of a read operation—if a refresh period is performed within any time after the time at the time point 551, there would be not enough power to perform the refresh operation. In one implementation, the processing device can assign a time corresponding to the time point 551 as the refresh period for the group. That is, the processing device can initiate a refresh operation at or shortly before 32 hours have passed since the last write operation on a respective segment of the memory component.

In another implementation, the processing device can determine a time point (e.g., the time point 553) within a threshold amount 552 of the time point 551. Such a threshold amount can be a relative value, such as 10%, or an absolute value, such as, 2 hours. For example, the time point 551 can be 32 hours and the threshold amount 552 can be 2 hours. Then, the processing device can determine another time point 553 (e.g., 30 hours) based on the maximum time a refresh operation should be performed (as represented by the time point 551) and the threshold amount 552. The processing device can assign a refresh period of 30 hours to the group requiring the most power for performance of a read operation.

Similarly, the processing device can determine a refresh period for a group requiring a lower amount of power for performance of a read operation based on the curve 520. For example, the processing device can determine that a time period represented by a time point 555 (e.g., 40 hours) as the refresh period. In another implementation, the processing device can determine a time period less than the maximum time period represented by the time point 555 using the same threshold 552. Moreover, the processing device can determine a refresh period for a group requiring the lowest amount of power for performance of a read operation as 48 hours as represented by a time point 557 based on the curve 530. As illustrated by the curves 510 to 530, as memory components require lower amount of power for performance of a read operation, the processing device sets the refresh time period to be at a longer amount of time. Therefore, based on the different refresh periods for different groups, the processing device can determine appropriate refresh period for a changed operation condition, for example, at operation 430 of FIG. 4. Accordingly, the processing device can adjust a refresh period in order to accommodate various power consumption characteristics of memory components.

Figure 6:
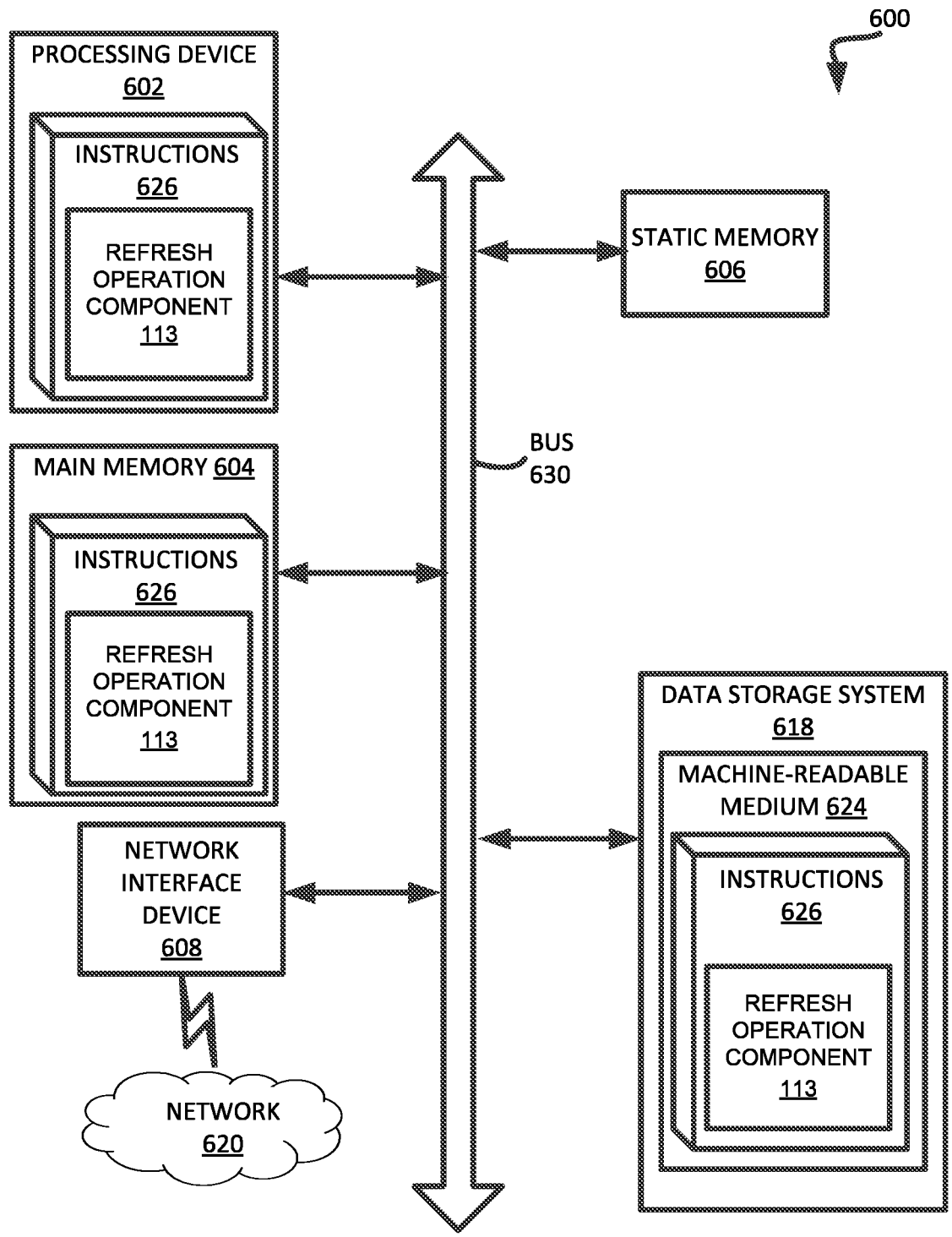
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the refresh operation component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a refresh operation component (e.g., the refresh operation component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory component; and
    a processing device, operatively coupled with the memory component, to:
        determine that a current operation condition of the memory component is in a first state;
        detect a change in the operation condition from the first state to a second state;
        set a refresh period associated with the memory component based on the change in the operation condition, the refresh period corresponding to a period of time between a first time when a write operation is performed on a segment of the memory component and a second time when a refresh operation is to be performed on the segment, and wherein to set the refresh period, the processing device is to:
            determine a range of the operation condition to which the second state belongs;
            determine a second refresh period associated with the range of the operation condition; and
            change the refresh period associated with the memory component to correspond to the second refresh period associated with the range of the operation condition; and
        perform the refresh operation according to the refresh period.

2. The system of claim 1, wherein the operation condition of the memory component includes at least one of an amount of power supplied to the system or a temperature of the memory component.

3. The system of claim 1, wherein to detect the change in the operation condition from the first state to the second state, the processing device is to:
    determine a first range of the operation condition to which the first state belongs;
    determine whether the second state belongs to the first range of the operation condition; and
    responsive to determining that the second state does not belong to the first range of the operation condition, determining that the change in the operation condition is detected.

4. The system of claim 1, wherein to set the refresh period associated with the memory component based on the change of the operation condition, the processing device is to:
    responsive to detecting that the change in the operation condition corresponds to an increase in a temperature of the memory component, decrease the refresh period associated with the memory component based on the second state of the operation condition.

5. The system of claim 1, wherein to set the refresh period associated with the memory component based on the change of the operation condition, the processing device is to:
    responsive to detecting that the change in the operation condition corresponds to a decrease in a temperature of the memory component, increase the refresh period associated with the memory component based on the second state of the operation condition.

6. The system of claim 1, wherein to set the refresh period associated with the memory component based on the change of the operation condition, the processing device is to:
    responsive to detecting that the change in the operation condition corresponds to an increase in an amount of power supply to the system, increase the refresh period associated with the memory component based on the second state of the operation condition.

7. The system of claim 1, wherein to set the refresh period associated with the memory component based on the change of the operation condition, the processing device is to:

responsive to detecting that the change in the operation condition corresponds to a decrease in an amount of power supply to the system, decrease the refresh period associated with the memory component based on the second state of the operation condition.

8. The system of claim 1, wherein the processing device is to determine the current operation condition of the memory component on a periodic basis.

9. A method comprising:
  determining that a current operation condition of a memory component is in a first state;
  detecting a change in the operation condition from the first state to a second state;
  setting a refresh period associated with the memory component based on the change in the operation condition, the refresh period corresponding to a period of time between a first time when a write operation is performed on a segment of the memory component and a second time when a refresh operation is to be performed on the segment, wherein setting the refresh period comprises:
    determining a range of the operation condition to which the second state belongs;
    determining a second refresh period associated with the range of the operation condition; and
    changing the refresh period associated with the memory component to correspond to the second refresh period associated with the range of the operation condition; and
  performing the refresh operation according to the refresh period.

10. The method of claim 9, wherein the operation condition of the memory component includes at least one of an amount of power supplied to the memory component or a temperature of the memory component.

11. The method of claim 9, wherein the detecting of the change in the operation condition from the first state to the second state comprises:
  determining a first range of the operation condition to which the first state belongs;
  determining whether the second state belongs to the first range of the operation condition; and
  responsive to determining that the second state does not belong to the first range of the operation condition, determining that the change in the operation condition is detected.

12. The method of claim 9, wherein the setting of the refresh period associated with the memory component comprises:
  responsive to detecting that the change in the operation condition to an increase in a temperature of the memory component, decreasing the refresh period associated with the memory component based on the second state of the operation condition; and
  responsive to detecting that the change in the operation condition corresponds to a decrease in the temperature of the memory component, increasing the refresh period associated with the memory component based on the second state of the operation condition.

13. The method of claim 9, wherein the setting of the refresh period associated with the memory component comprises:
  responsive to detecting that the change in the operation condition from the first state to the second state corresponds to an increase in an amount of power supply to the memory component, increasing the refresh period associated with the memory component based on the second state of the operation condition; and
  responsive to detecting that the change in the operation condition corresponds to a decrease in the amount of power supply to the memory component, decreasing the refresh period associated with the memory component based on the second state of the operation condition.

14. The method of claim 9, wherein the determining of the current operation condition of the memory component is performed on a periodic basis.

15. A system comprising:
  a plurality of memory components; and
  a processing device, operatively coupled with the plurality of memory components, to:
    receive a command for a write operation to store data on a segment of a memory component of the plurality of memory components;
    identify the memory component associated with the write operation from the plurality of memory components;
    determine a first refresh period corresponding to the identified memory component from a plurality of refresh periods, wherein each one of the plurality of refresh periods corresponds to a different one or more of the plurality of memory components, and wherein the first refresh period corresponding to a period of time between a first time when the write operation is performed on the segment of the memory component and a second time when a refresh operation is to be performed on the segment of the memory component; and
    responsive to determining that a command for a read operation to be performed on the segment of the memory component is not received within the first refresh period, perform the refresh operation on the segment of the memory component.

16. The system of claim 15, wherein to determine the first refresh period corresponding to the identified memory component from the plurality of refresh periods, the processing device is to:
  determine a first group from a plurality of groups to which the identified memory component belongs, wherein each group of the plurality of groups includes a different one or more of the plurality of memory components, corresponds to each one of the plurality of refresh periods, and is associated with different ranges of an amount of power required for a read operation, and wherein each memory component in a same group requires an amount of power within a same range for a read operation be performed on a segment of a respective memory component in a same amount of time after a write operation was performed on the segment; and
  determine the first refresh period corresponding to the first group.

17. The system of claim 16, wherein a group from the plurality of groups associated with a higher range of the amount of power required for the read operation corresponds to a refresh period having a shorter period of time in the plurality of refresh periods.

18. The system of claim 16, wherein a group from the plurality of groups associated with a lower range of the amount of power required for the read operation corresponds to a refresh period having a longer period of time in the plurality of refresh periods.

* * * * *